United States Patent
Lee

(10) Patent No.: US 7,606,087 B2
(45) Date of Patent: Oct. 20, 2009

(54) SEMICONDUCTOR MEMORY DEVICE AND OVER DRIVING METHOD THEREOF

(75) Inventor: Young-Dae Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 52 days.

(21) Appl. No.: 12/007,189

(22) Filed: Jan. 8, 2008

(65) Prior Publication Data

US 2008/0165593 A1     Jul. 10, 2008

(30) Foreign Application Priority Data

Jan. 8, 2007    (KR)     ...................... 10-2007-0002095

(51) Int. Cl.
     *G11C 7/08*      (2006.01)

(52) U.S. Cl. .............................. 365/189.15; 365/189.09; 365/230.03; 365/227; 365/228; 365/190; 365/205; 365/208; 365/207

(58) Field of Classification Search ................. 365/227, 365/228, 226, 190, 196, 205, 208, 207, 230.03, 365/189.15, 189.09

See application file for complete search history.

(56) References Cited

U.S. PATENT DOCUMENTS 7,049,881 B2 *   5/2006   Moon et al. .................. 327/541
7,158,423 B2 *   1/2007   Seo ......................... 365/189.09
7,443,752 B2 *   10/2008   Ha ............................... 365/208
2007/0014171 A1 *   1/2007   Ha ............................... 365/208

FOREIGN PATENT DOCUMENTS

| | | |
|---|---|---|
| JP | 2000-011656 | 1/2000 |
| JP | 2000-057761 | 2/2000 |
| JP | 2001-135076 | 5/2001 |
| KR | 1020020068421 A | 8/2002 |
| KR | 1020040054362 A | 6/2004 |
| KR | 1020060123986 A | 12/2006 |

* cited by examiner

*Primary Examiner*—Andrew Q Tran
(74) *Attorney, Agent, or Firm*—Harness, Dickey & Pierce, P.L.C.

(57) ABSTRACT

A semiconductor memory device may include a power line, an over driver, and/or an internal voltage driver. The power line may be connected to at least one sense amplifier. The at least one sense amplifier may be connected to a memory cell included in a memory block. The memory block may be included in one of a plurality of memory block units including one or more memory blocks. The over driver may be configured to apply an external voltage to the power line in a sensing period of the sense amplifier. The internal voltage driver may be configured to apply an internal voltage to the power line in an amplification period of the sense amplifier. The over driver may be configured to perform an over driving operation by each memory block unit.

23 Claims, 8 Drawing Sheets

SEMICONDUCTOR MEMORY DEVICE AND OVER DRIVING METHOD THEREOF

PRIORITY STATEMENT

This U.S. non-provisional patent application claims the benefit of priority under 35 U.S.C. § 119 to Korean Patent Application No. 10-2007-0002095, filed on Jan. 8, 2007, the entire contents of which are incorporated herein in their entirety by reference.

BACKGROUND

1. Field

Example embodiments relate to a semiconductor memory device, and for example, to an over driver of a semiconductor memory device and/or an over driving method thereof.

2. Description of Related Art

As semiconductor memory devices become more highly integrated and have lower-power consumption, a lower driving voltage and a higher-speed operation are required. As drive voltages of the semiconductor memory devices have been gradually lowered, several technical solutions for assisting an operation of a sense amplifier in the semiconductor memory devices have been proposed. One of the proposed solutions is a method of over-driving the sense amplifier.

The sense amplifier amplifies a voltage difference between a pair of bit lines. Therefore, a data read/write operation and a data refresh operation of a memory cell may be performed. The operations of the sense amplifier are controlled by a sense amplifier controller.

In a conventional sense amplifier, a P-channel metal oxide silicon (PMOS) transistor has a voltage-driving capability that is relatively lower than that of an N-channel metal oxide silicon (NMOS) transistor. That is, the voltage driving capability of the PMOS transistor is about twice as high as that of the NMOS transistor. However, with an increase in a memory capacity of a DRAM, a chip size of the DRAM becomes smaller. Accordingly, the size of the PMOS transistor in the sense amplifier is substantially equal to that of the NMOS transistor. As a result, the data-driving capability of the PMOS transistor is reduced. In particular, a limitation occurs if bit line data is amplified to a higher voltage in the sense amplifier. In order to resolve this limitation, a conventional method over-drives a sense amplifier to over-drive sensing data if the sense amplifier is enabled.

If an over-driven sense amplifier is activated, an external voltage VEXT, e.g., about 3.3V, is applied to enhance a data sensing speed. Thereafter, an array internal voltage VINTA, e.g., about 2.2V, which is adjusted lower for maintaining an accumulated voltage, is applied to the sense amplifier. A target voltage (i.e., the internal voltage VINTA) takes a relatively longer time to reach while a precharge voltage VBL is pulled up to the internal voltage VINTA because a difference voltage between the internal voltage VINTA, e.g., about 2.2V, and the precharge voltage VBL is relatively not that great, i.e, relatively smaller. In order to overcome this limitation, the external voltage VEXT, e.g., about 3.3V, is applied during a desired, or alternatively, a predetermined period. A method of applying the external voltage VEXT during the desired, or alternatively, the predetermined period is called an "over driving method."

A conventional over driving method provides the external voltage VEXT through a power line of a mesh structure by each bank unit. However, the power line of the mesh structure causes vulnerable nodes in respective regions if considering resistance capacitance (RC) delay. As a result, an over driving effect of the sense amplifier is remarkably reduced in the vulnerable nodes.

SUMMARY

Example embodiments may provide a semiconductor memory device configured to improve an over driving effect and/or an over driving method thereof.

According to an example embodiment, a semiconductor memory device may include a power line, an over driver, and/or an internal voltage driver. The power line may be connected to at least one sense amplifier. The at least one sense amplifier may be connected to a memory cell included in a memory block. The memory block may be included in one of a plurality of memory block units including one or more memory blocks. The plurality of memory block units may be included in a memory cell array. The over driver may be configured to apply an external voltage to the power line in a sensing period of the at least one sense amplifier. The internal voltage driver may be configured to apply an internal voltage to the power line in an amplification period of the sense amplifier. The over driver is configured to perform an over driving operation by each memory block unit.

According to an example embodiment, the semiconductor memory device may include a block signal generator configured to generate a block signal. The over driver may be configured to perform the over driving operation by each memory block unit in response to the block signal.

According to an example embodiment, the block signal generator may be a row decoder, and/or the row decoder may be configured to receive an address and generate the block signal based on a most significant bit (MSB) of the address.

According to an example embodiment, the over driver may include a current adjustment circuit configured to adjust an amount of current flowing through the power line such that the external voltage is applied to the power line at a given rate.

According to an example embodiment, the internal voltage driver may be configured to stop operating if the over driver is operating.

According to an example embodiment, the external voltage may be applied during a period from a starting point of a sensing operation.

According to an example embodiment, the over driver may be disposed outside of the memory cell array.

According to an example embodiment, the over driver may be connected to both ends of the power line, and/or the over driver may be configured to apply the external voltage to both ends of the power line.

According to an example embodiment, the power line may be a pair of power lines connected to a pair of complementary bit lines of the at least one sense amplifier, and/or the pair of power lines may be configured to apply a voltage to the pair of complementary bit lines. The internal voltage driver may be a plurality of internal voltage drivers configured to apply the internal voltage to the pair of power lines during the amplification period of the at least one sense amplifier. The over driver may be a plurality of over drivers configured to apply the external voltage to the pair of power lines during the sensing period of the at least one sense amplifier. The plurality of over drivers may be configured to perform the over driving operation by each memory block unit.

According to an example embodiment, a semiconductor memory device may include a memory cell array, an over driver, a controller, and/or a row decoder. The memory cell array may include a plurality of memory blocks, the plurality of memory blocks included in a plurality of memory block units including one or more of the plurality of memory blocks, each of the memory blocks including at least one sense amplifier connected to a memory cell. The over driver may be configured to perform an over driving operation on the at least one sense amplifier. The controller may be configured to generate a first signal if a sensing operation of the at least one sense amplifier is started. The row decoder may be configured to receive an address, decode the address to activate a corresponding word line of the memory cell array, and/or generate a second signal to select the one or more memory blocks corresponding to a memory block unit. The over driver may be configured to perform the over driving operation by each memory block unit in response to the first and second signals.

According to an example embodiment, the second signal may be based on a most significant bit (MSB) of the address.

According to an example embodiment, the memory cell array may include a plurality of power lines configured to apply a voltage to bit lines of sense amplifiers of each of the memory blocks, and/or the over driver may be configured to apply an external voltage to the power lines of the selected memory block unit in response to the first and second signals.

According to an example embodiment, the memory cell array may include an internal voltage driver configured to apply an internal voltage to the power lines.

According to an example embodiment, the power lines may be configured to receive the internal voltage from the internal voltage driver in an amplification period of the sense amplifier.

According to an example embodiment, the over driver may include a current adjustment circuit configured to adjust an amount of current flowing through the power lines such that the external voltage is applied to the power lines at a given rate.

According to an example embodiment, the current adjustment circuit may be turned on in response to a third signal, and/or the third signal may be provided from an inside of the controller.

According to an example embodiment, the over driver may be disposed above and below the memory cell array.

According to an example embodiment, the second signal may include a plurality of block signals for selecting memory blocks, and/or the over driver may include a plurality of external voltage generators configured to receive the first signal and the plurality of block signals to generate the external voltage.

According to an example embodiment, an over driving method of a sense amplifier may include generating an over driving signal in a sensing period of the sense amplifier. A portion of a plurality of memory blocks may be selected to be over-driven. An over driving operation may be performed on only the selected portion of the plurality of memory blocks in response to the over driving signal.

According to an example embodiment, the selecting the portion of the plurality of memory blocks may include generating a block signal for selecting the memory blocks.

According to an example embodiment, the block signal may be generated based on a most significant bit (MSB) of an inputted address.

According to an example embodiment, the over driving signal may be generated if a sensing operation of the sense amplifier is started.

According to an example embodiment, the performing the over driving operation may include adjusting an amount of current applied to the sense amplifier such that a given amount of current flows if the over driving operation is performed.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
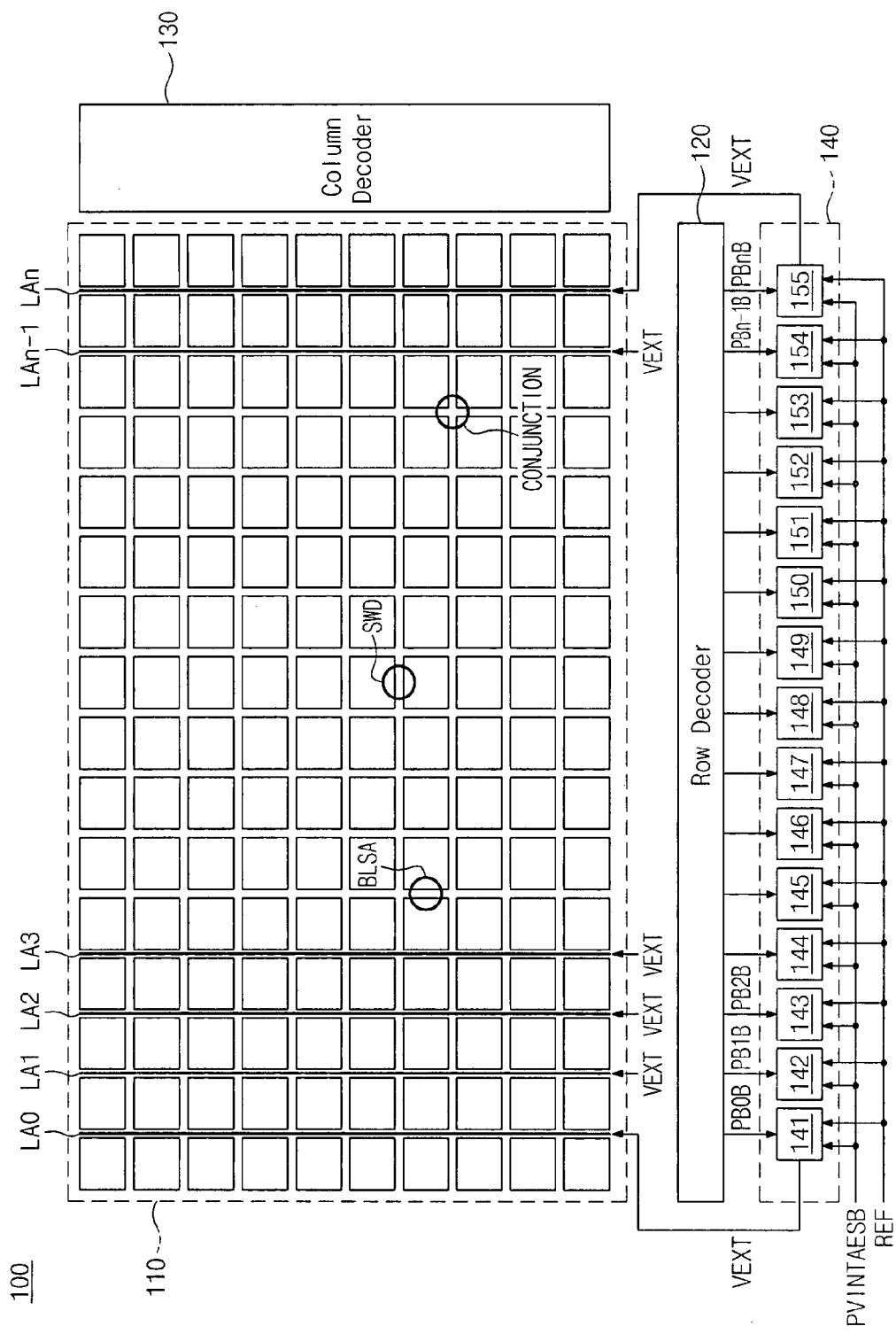
FIG. 1 is a block diagram of a semiconductor memory device according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 1 is a block diagram of a semiconductor memory device 100 according to an example embodiment. Referring to FIG. 1, the semiconductor memory device 100 may include a memory cell array 110, a row decoder 120, a column decoder 130, and/or an over driving unit 140. The semiconductor memory device 100 may over-drive a sense amplifier (not shown) by each memory block unit. Each memory block unit may represent one or more memory blocks.

The memory cell array 110 may include a plurality of memory blocks BLK0 through BLKn including a plurality of memory cells, a plurality of power lines LA0 through LAn, a plurality of bit line sense amplifiers BLSA, a plurality of sub-word line drivers SWD, and/or a plurality of conjunctions CONJUNCTION. The memory cell array 110 may write or read data by a word line select signal outputted from the row decoder 120 and a bit line select signal outputted from the column decoder 130. Voltages, e.g., an internal voltage VINTA and an external voltage VEXT, for operating the bit line sense amplifier BLSA may be applied to bit lines through the power lines LA0 through LAn. The bit line sense amplifier BLSA, the sub-word line driver SWD, and the conjunction CONJUNCTION will be described in detail with reference to FIG. 2.

The row decoder 120 may decode an address outputted from an address buffer (not shown) to output the word line select signal. A corresponding block of the memory cell array may be activated in response to the word line select signal. The row decoder 120 of an example embodiment may generate block signals PB0B through PBnB, which select a memory block to be over-driven, and/or the generated block signals PB0B through PBnB may be sent to the over driving unit 140. The block signals PB0B through PBnB may use a most significant bit (MSB) of an inputted address. If the memory block to be over-driven is one, the block signals PB0B through PBnB may use the word line select signal.

The column decoder 130 may receive and decode a first decode signal for selecting a bit line outputted from a global column decoder (not shown) and/or may receive and decode a second decode signal for selecting a column group to connect a bit line of a corresponding column group to a data line.

The over driving unit 140 may include a plurality of over drivers 141 through 155. Each of the over drivers 141 through 155 may receive an over driving signal PVINTAESB, a corresponding one of the block signals PB0B through PBnB, and/or a reference voltage REF. Each of the over drivers 141 through 155 may apply an external voltage VEXT to only power lines selected from the power lines LA0 through LAn based on the over driving signal PVINTAESB, the block signals PB0B through PBnB, and/or the reference voltage REF.

A controller (not shown) of the semiconductor memory device 100 may generate and output the over driving signal PVINTAESB. The row decoder 120 may output the block signals PB0B through PBnB. An internal voltage generating circuit (not shown) of the semiconductor memory device 100 may output the reference voltage REF. The reference voltage REF may be used for adjusting an amount of current so that the external voltage VEXT may not be more suddenly applied to the power lines LA0 through LAn. For example, the reference voltage REF may be used to apply the external voltage to the power lines LA0 through LAn at a desired, or alternatively, a predetermined rate.

The semiconductor memory device 100 may perform an over driving operation through the over driving unit 140 by each of the plurality of block units.

Figure 2:
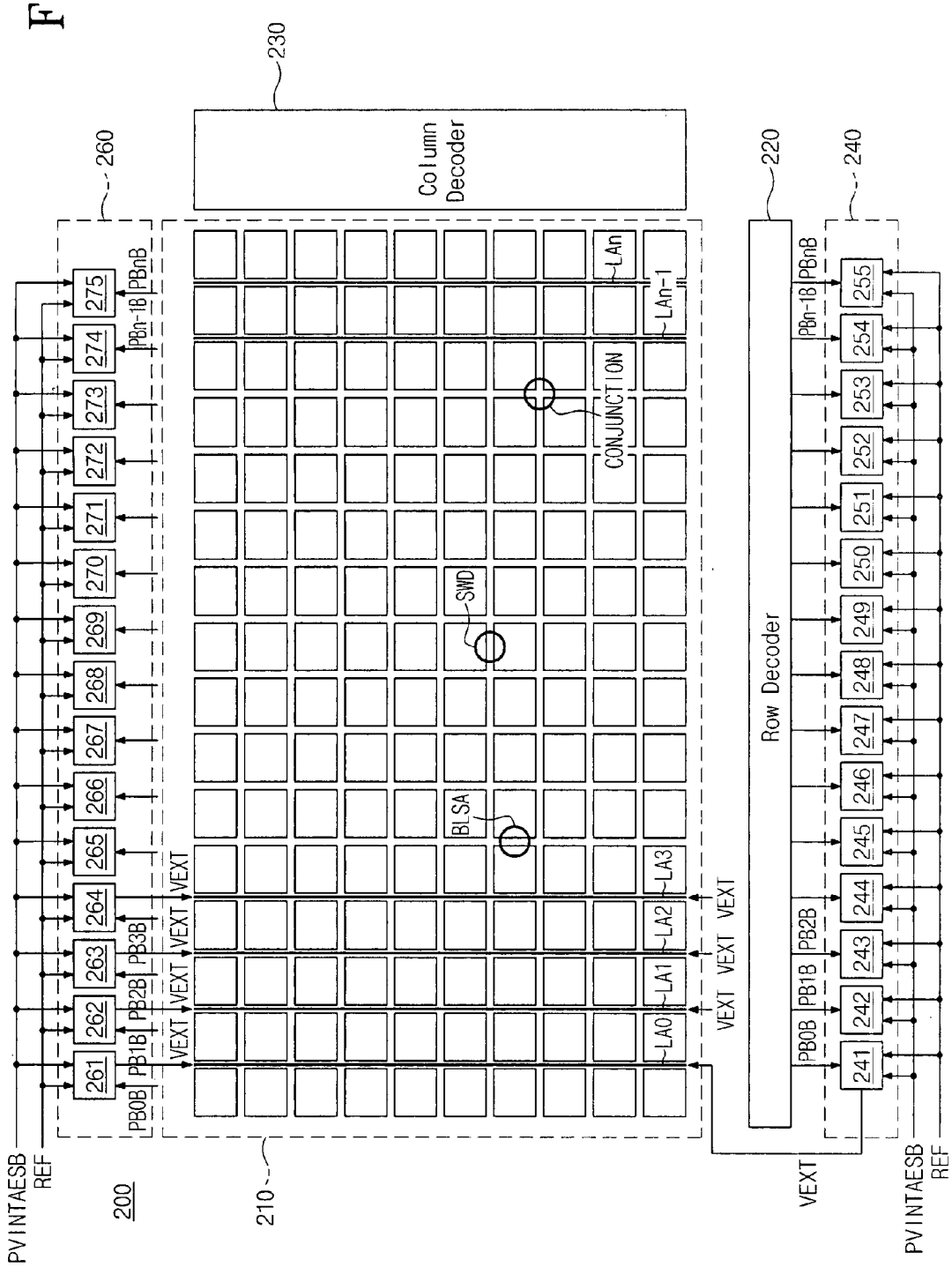
FIG. 2 is a block diagram of a semiconductor memory device according to another example embodiment.

FIG. 2 is a block diagram of a semiconductor memory device 200 according to another example embodiment. Referring to FIG. 2, the semiconductor memory device 200 may include a first over driving unit 240 and/or a second over driving unit 260. The first over driving unit 240 may include a plurality of over drivers 241 through 255. The second over driving unit 260 may include a plurality of over drivers 261 through 275. The semiconductor memory device 200 may include a column decoder 230 and/or a row decoder 220.

An external voltage VEXT may be simultaneously applied from the first and second over driving units 240 and 260 to each of power lines LA0 through LAn. For example, both ends of each of the power lines LA0 through LAn may be connected to corresponding over drivers in the first and second over driving units 240 and 260, respectively.

Referring to FIG. 2, the first over driving unit 240 may be disposed below a memory cell array 210. The second over driving unit 260 may be disposed above the memory cell array 210.

Figure 3:
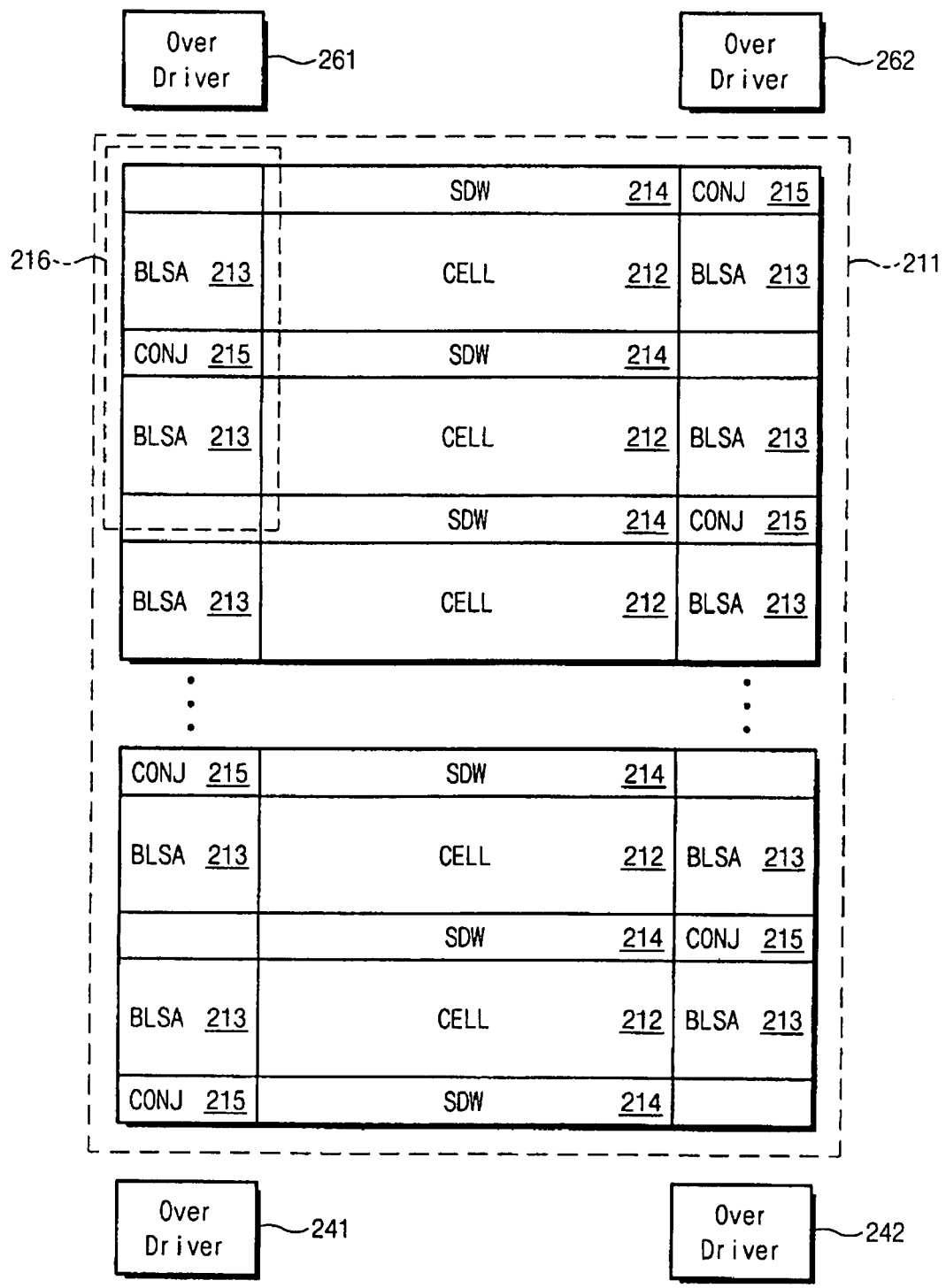
FIG. 3 is a block diagram of a memory block in a memory cell array illustrated in FIG. 2.

FIG. 3 is a block diagram of a memory block 211 in the memory cell array 210 illustrated in FIG. 2. Referring to FIG. 3, the memory block 211 may include a plurality of sub blocks. For convenience of description, the memory block 211 will be described using a first block.

The sub blocks may include a plurality of memory cells 212, a plurality of bit line sense amplifiers 213, a plurality of sub word line drivers 214, and/or conjunctions 215. A corresponding bit line sense amplifier 213 and a corresponding sub word line driver 214 may be connected to each of memory cells 212. The conjunction 215 may indicate a region where the sub word line driver 214 and the bit line sense amplifier 213 intersect each other. The conjunction 215 may include an internal voltage driver (not shown) configured to control application of the internal voltage VINTA used as a voltage source of the bit line sense amplifier 213, a bit line equalizer (not shown), and/or a circuit Pxi (not shown) for driving word lines.

Figure 4:
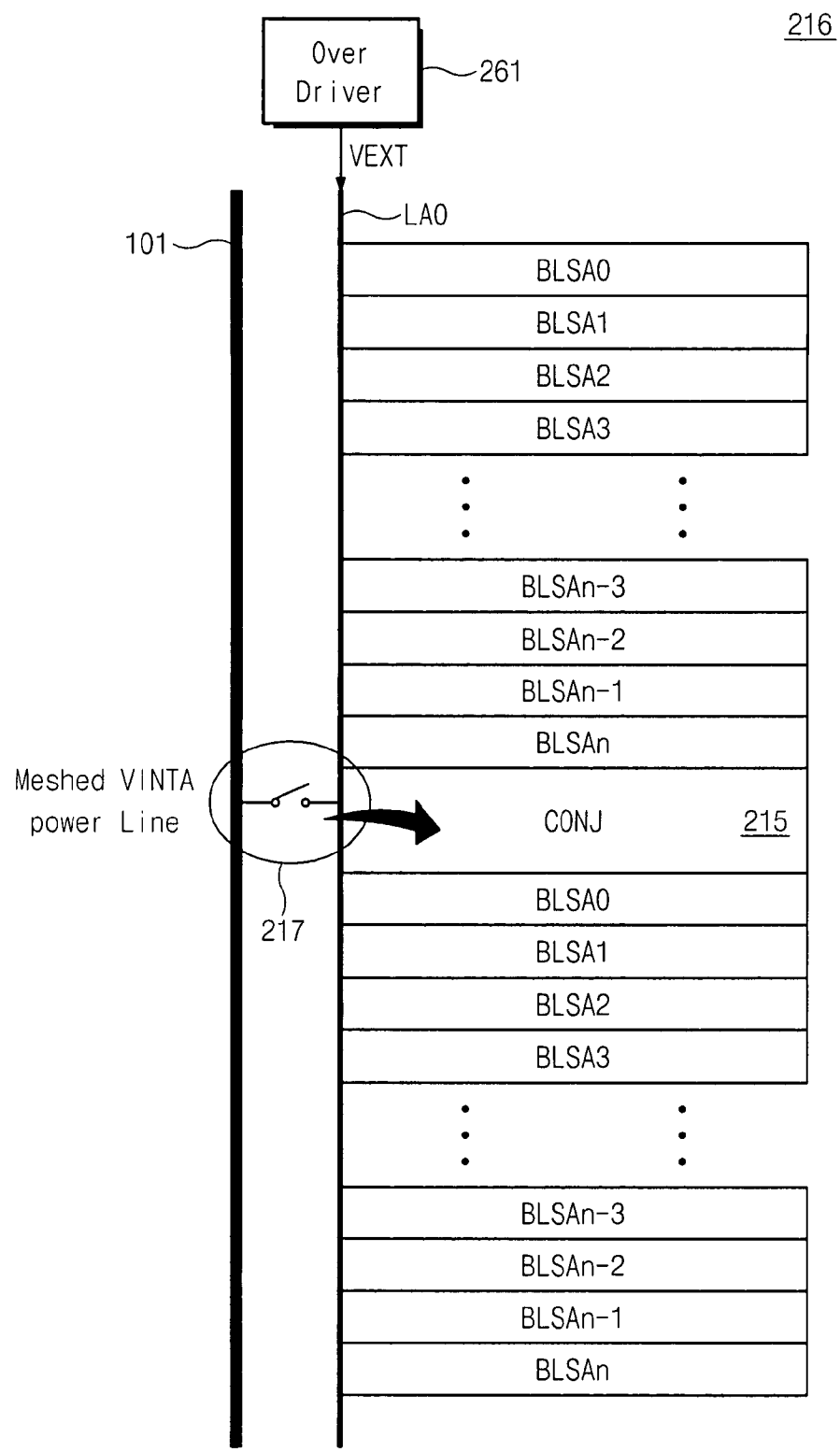
FIG. 4 is an enlarged view of a portion of the memory block with a conjunction illustrated in FIG. 3.

FIG. 4 is an enlarged view of a portion 216 of the memory block 211 with the conjunction 215 illustrated in FIG. 3. Referring to FIG. 4, a power line LA0 may be connected to an over driver 261 and an internal voltage driver 217. The internal voltage driver 217 may be disposed in the conjunction 215.

The internal voltage driver 217 may supply the internal voltage VINTA from an internal voltage power line 101 of a mesh structure to the power line LA0. Accordingly, bit lines BLSA0 through BLSAn may receive the internal voltage VINTA through the power line LA0. The internal voltage driver 217 may control the supply of the internal voltage VINTA through the power line LA0.

The over driver 261 may supply the external voltage VEXT to the power line LA0 only if the first memory block BLK0 is selected as a memory block to be over-driven. Whether the first memory block BLK0 is selected or not may be determined according to a block signal PB0B received from the row decoder 220.

The sense amplifiers of an example embodiment may perform an over driving operation on only a plurality of selected memory blocks, e.g., by each memory block unit. Accordingly, vulnerable nodes that are caused by a conventional over-driven sense amplifier may not be generated.

Figure 5:
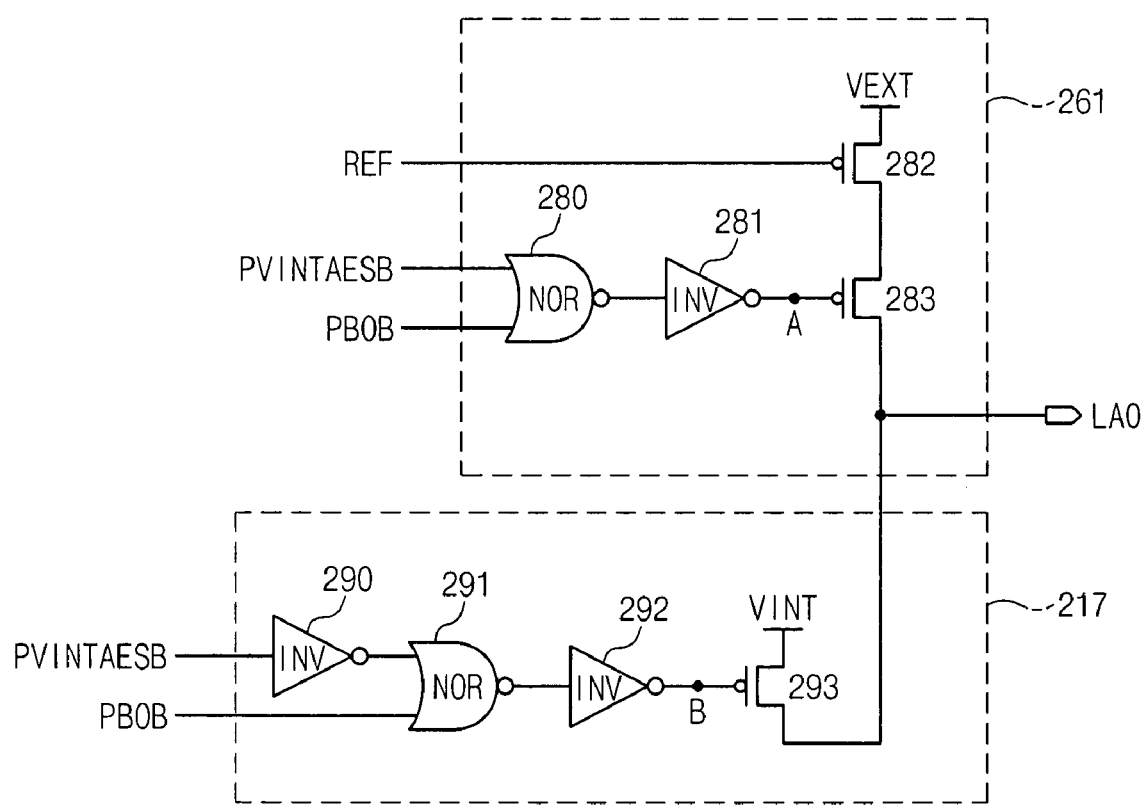
FIG. 5 is a circuit diagram of an internal voltage driver and an over driver according to an example embodiment.

FIG. 5 is a circuit diagram of an internal voltage driver 217 and an over driver 261 according to an example embodiment. Referring to FIG. 5, the internal voltage driver 217 may apply the internal voltage VINTA to a power line LA0 in response to an over driving signal PVINTAESB and/or a block signal PB0B. The over driver 261 may apply an external voltage VEXT to the power line LA0 in response to the over driving signal PVINTAESB, the block signal PB0B, and a reference voltage REF.

Referring to FIG. 5, the internal voltage driver 217 may include inverters 290 and 292, a PMOS transistor 293, and/or an NOR gate 291. An operation of the internal voltage driver 217 will be described below.

The inverter 290 may receive the over driving signal PVINTAESB from a controller (not shown) of a semiconductor memory device 200, invert the over driving signal PVINTAESB, and/or output the inverted over driving signal PVINTAESB. The NOR gate 291 may receive the inverted over driving signal PVINTAESB outputted from the inverter 290 and a block signal PB0B outputted from a row decoder 220, perform an NOR operation, and/or output the NOR operation results. The inverter 292 may invert the signal outputted from the NOR gate 291 and output the inverted signal. The PMOS transistor 293 may supply the internal voltage VINTA to the power line LA0 in response to the inverted signal outputted from the inverter 292.

A conjunction 215 may include the internal voltage driver 217, but the conjunction 215 need not include the internal voltage driver 217. Considering a limitation due to the size of the conjunction 215, only the PMOS transistor 293 may be included in the conjunction 215 with the internal voltage driver 217, and the remainder of the internal voltage driver 217 may be disposed outside of the memory cell array 210.

Referring to FIG. 5, the over driver 261 may include an NOR gate 280, an inverter 281, and/or PMOS transistors 282 and 283.

An operation of the over driver 261 will be described below. The NOR gate 280 may receive the over driving signal PVINTAESB from the controller (not shown) and the block signal PB0B outputted from the row decoder 220, perform a NOR operation, and/or output the NOR operation results. The inverter 281 may invert the signal outputted from the NOR gate 291. The PMOS transistor 283 may supply the external voltage VEXT to the power line LA0 in response to the inverted signal outputted from the inverter 281. An amount of current to be applied according to the reference voltage REF may be adequately adjusted by the PMOS transistor 282 in response to the reference voltage REF.

Figure 6:
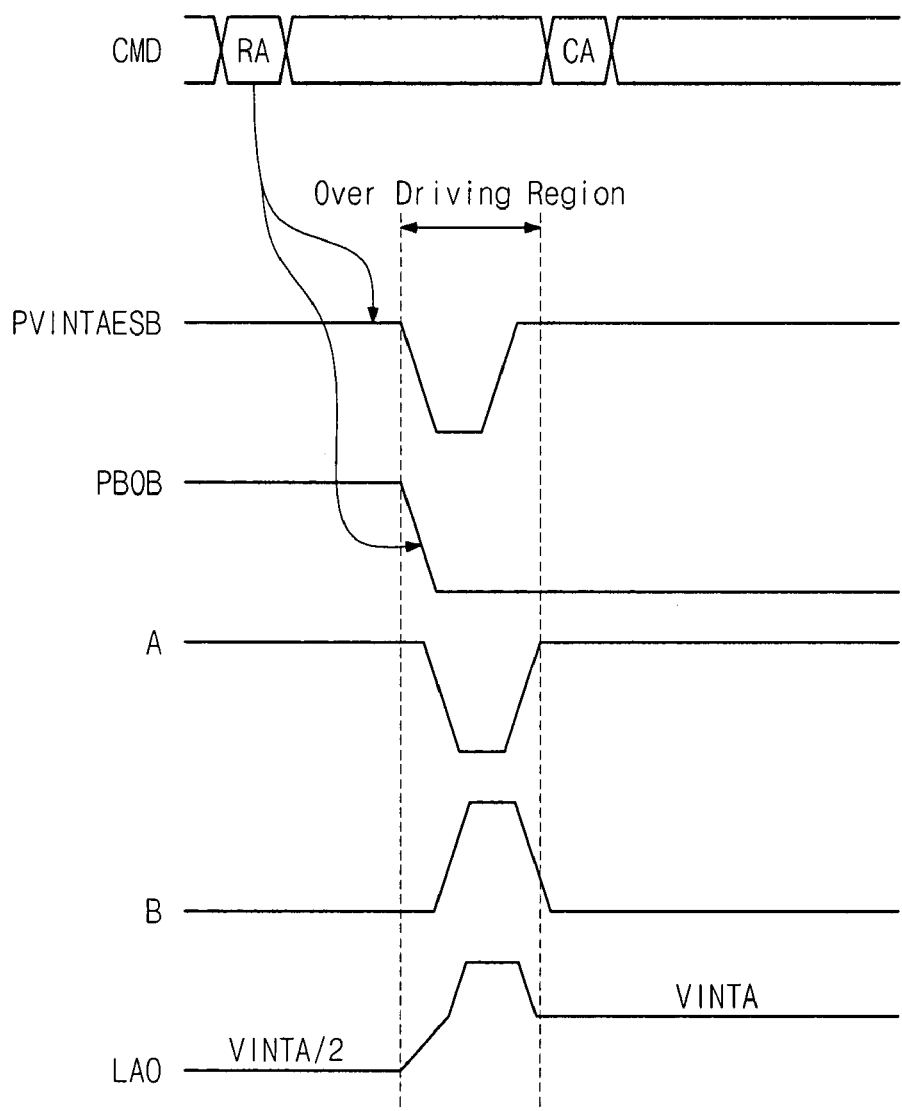
FIG. 6 is an example timing diagram of a voltage level change in a power line LAO according to the over driver and the internal voltage driver illustrated in FIG. 5.

FIG. 6 is an example timing diagram of a voltage level change in a power line LA0 according to the over driver 261 and the internal voltage driver 217 illustrated in FIG. 5.

Referring to FIGS. 5 and 6, a method for driving a bit line sense amplifier 213 of the semiconductor memory device 200 will be described below. The semiconductor memory device 200 may be synchronized with a row address RA to generate the over driving signal PVINTAESB during a desired, or alternatively, a predetermined period. The over driving signal PVINTAESB may be pulled down to a low level at a same time as a sensing operation of the bit line is started. The semiconductor memory device 200 may generate the block signal PB0B selecting a first memory block from the row decoder 220 in response to the row address RA. The generated block signal PB0B may be at the low level. The over driving signal PVINTAESB and the block signal PB0B may be input to the internal voltage driver 217 and/or the over driver 261. Accordingly, a node A, which is between an output of the inverter 281 and a gate of the PMOS transistor 283, may become a low level to turn on the PMOS transistor 283 of the over driver 261, and/or a node B, which is between an output of the inverter 292 and a gate of the PMOS transistor 293, may become a high level to turn off the PMOS transistor 293 of the internal voltage driver 217. Therefore, the external voltage VEXT may be applied to the power line LA0 during the desired, or alternatively, the predetermined period. The desired, or alternatively, the predetermined period may exist within a sensing period of the bit line sense amplifier 213.

If an over driving operation during a desired, or alternatively, a predetermined time is completed, the over driving signal PVINTAESB may become a high level as shown in FIG. 6. The block signal PB0B may maintain a low level. Accordingly, the node A may become a high level to turn off the PMOS transistor 283 of the over driver 261, and/or the node B may become a low level to turn on the PMOS transistor 293 of the internal voltage driver 217. Therefore, the internal voltage VINTA may be applied to the power line LA0. As a result, the power line LA0 may become an internal voltage level, and/or the bit line sense amplifier 213 may apply the internal voltage VINTA, which is applied to the power line LA0, to the bit lines. The bit line sense amplifier 213 may receive a column address CA to activate a corresponding bit line BL and read/write data. Accordingly, in the bit line sense amplifier 213, a voltage level of the bit line BL may become a half level of the internal voltage VINTA in response to a precharge command.

Figure 7:
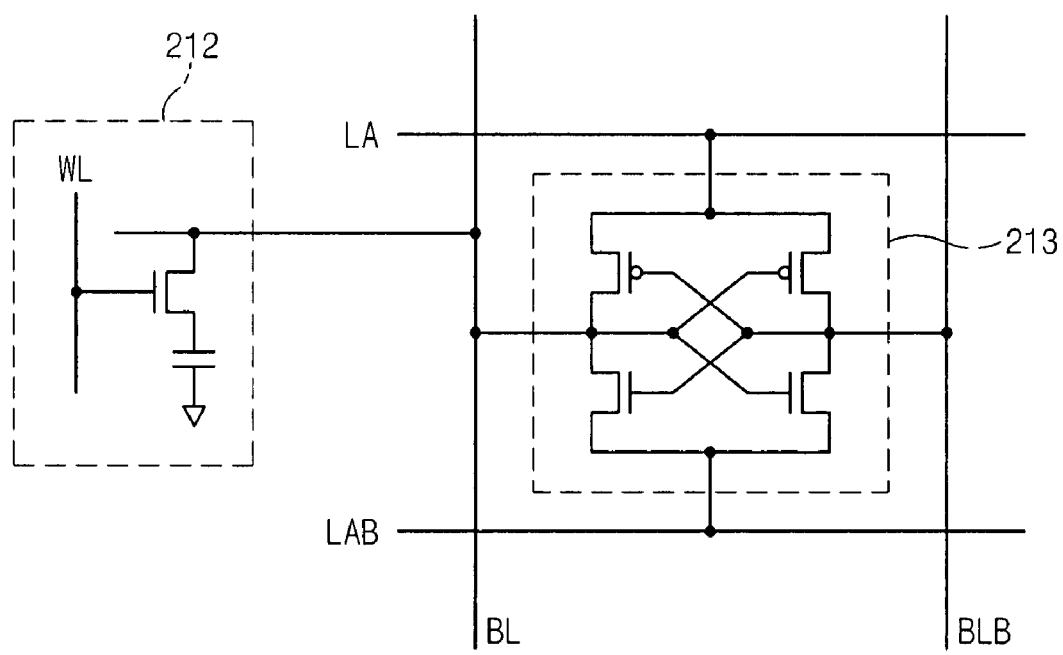
FIG. 7 is a circuit diagram of a bit line sense amplifier receiving a voltage from complementary power lines LA and LAB according to an example embodiment.

FIG. 7 is a circuit diagram of a bit line sense amplifier 213 configured to receive a voltage from complementary power lines LA and LAB according to an example embodiment. Referring to FIG. 7, a memory cell 212 may be connected to a bit line BL of the bit line sense amplifier 213.

An operation of the bit line sense amplifier 213 will be described below. The bit line sense amplifier 213 may be synchronized with a row address RA to perform a charge-sharing operation. The bit line sense amplifier 213 may receive the over driving signal PVINTAESB if a sensing operation is started to perform an over driving operation during a desired, or alternatively, a predetermined period. The bit line BL may receive an external voltage VEXT from the power line LA, and a bit line BLB may receive an external voltage VSS from the power line LAB. After the sensing operation is completed, the bit line sense amplifier 213 may amplify data, which is read from the memory cell 212 according to a read command or a write command, and data to be read in the memory cell 212. The bit line BL may receive an internal voltage VINTA from the power line LA, and/or the bit line BLB may receive about 0 V from the power line LAB. After the amplifying of the bit line sense amplifier 213 is completed, the power lines LA and LAB may be connected to each other so that the bit lines BL and BLB of the bit line sense amplifier 213 are equalized. Therefore, voltage levels of the bit lines BL and BLB may become half a level of the internal voltage VINTA.

Figure 8A:
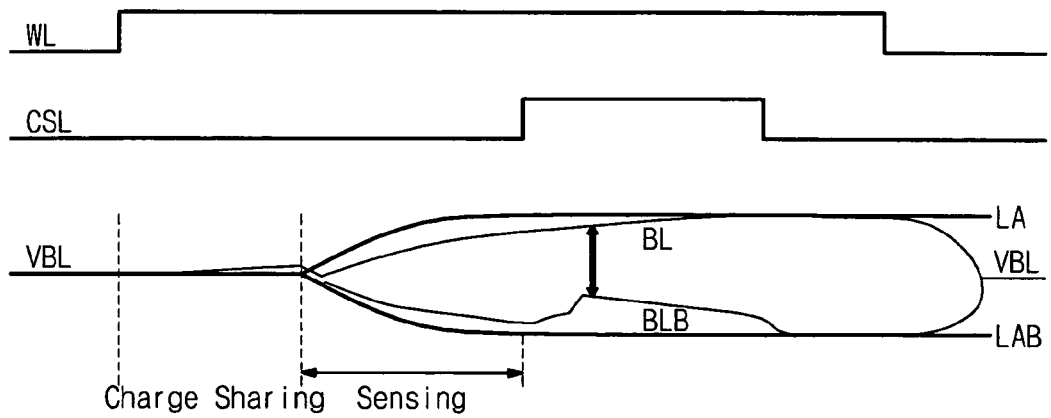
FIGS. 8A and 8B are example timing diagrams illustrating an activation state of each pair of complementary bit lines in a conventional memory device and a memory device according to an example embodiment, respectively.
Figure 8B:
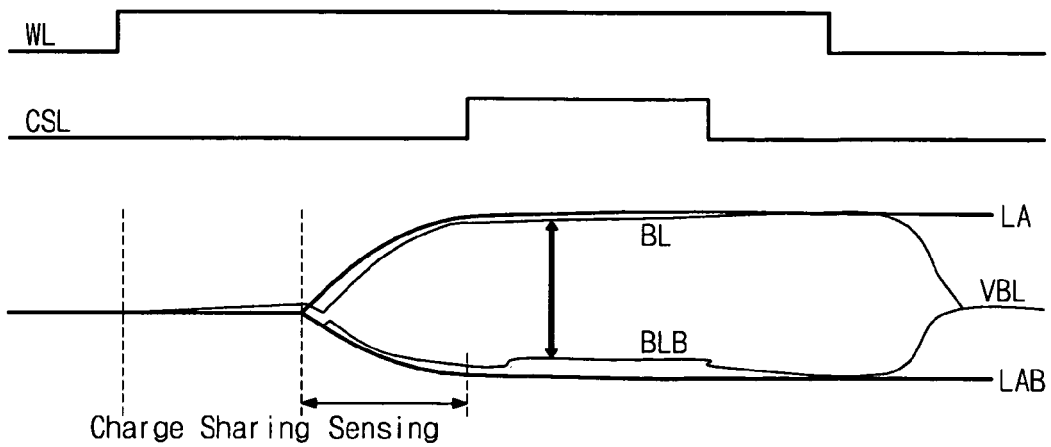

FIGS. 8A and 8B are views illustrating an activation state of each pair of complementary bit lines in a conventional semiconductor memory device and a semiconductor memory device 200 of an example embodiment, respectively. FIG. 8A is a view illustrating the activation state of the bit line of the conventional semiconductor memory device. FIG. 8B is a view illustrating the activation state of the bit line of the semiconductor memory device 200 according to an example embodiment.

Referring to FIGS. 8A and 8B, the semiconductor memory device 200 of an example embodiment may have a sensing speed greater than that of the conventional semiconductor memory device. The semiconductor memory device 200 of an example embodiment may have a faster sensing speed because the semiconductor memory device of an example embodiment may perform an over driving operation by each of a plurality of memory block units.

Signal distortion of the bit line may be significantly reduced if the semiconductor memory device 200 of an example embodiment is compared to the conventional semiconductor memory device. In the semiconductor memory device 200 of an example embodiment, a difference in voltage level between the power line LA and the power line LAB may increase by more than about 100 mV before a column select line CSL is turned on. VBL may represent a voltage level of a precharge voltage, and WL may represent a word line voltage. Therefore, DC pass of a dynamic nanocrystal memory (DNM) and the bit line sense amplifier may be reduced.

The semiconductor memory device 200 of an example embodiment may perform the over driving operation by each memory block unit, thereby increasing the sensing speed and reducing the signal distortion of the bit line.

In the semiconductor memory device 200 of an example embodiment, the over driver 261 may be disposed at the outside of the memory cell array 210, however example embodiments are not limited thereto. The over driver 261 may be disposed inside the conjunction 215.

As described above, the semiconductor memory device of example embodiments may perform the over driving operation by each memory block unit, thereby increasing a sensing speed and/or reducing a signal distortion of the bit line.

Although example embodiments have been shown and described in this specification and figures, it would be appreciated by those skilled in the art that changes may be made to the illustrated and/or described example embodiments without departing from their principles and spirit.

What is claimed is:

1. A semiconductor memory device comprising:
a power line connected to at least one sense amplifier, the at least one sense amplifier connected to a memory cell included in a memory block, the memory block included in one of a plurality of memory block units including one or more memory blocks, the plurality of memory block units included in a memory cell array;
an over driver configured to apply an external voltage to the power line in a sensing period of the at least one sense amplifier; and
an internal voltage driver configured to apply an internal voltage to the power line in an amplification period of the sense amplifier,
wherein the over driver is configured to perform an over driving operation by each memory block unit.

2. The semiconductor memory device of claim 1, further comprising:
a block signal generator configured to generate a block signal, and
the over driver configured to perform the over driving operation by each memory block unit in response to the block signal.

3. The semiconductor memory device of claim 2, wherein the block signal generator is a row decoder, and
the row decoder is configured to receive an address and generate the block signal based on a most significant bit (MSB) of the address.

4. The semiconductor memory device of claim 2, wherein the over driver includes a current adjustment circuit configured to adjust an amount of current flowing through the power line such that the external voltage is applied to the power line at a given rate.

5. The semiconductor memory device of claim 1, wherein the internal voltage driver is configured to stop operating if the over driver is operating.

6. The semiconductor memory device of claim 1, wherein the external voltage is applied during a period from a starting point of a sensing operation.

7. The semiconductor memory device of claim 1, wherein the over driver is disposed outside of the memory cell array.

8. The semiconductor memory device of claim 1, wherein the over driver is connected to both ends of the power line, and
the over driver is configured to apply the external voltage to both ends of the power line.

9. The semiconductor memory device of claim 1, wherein the power line is a pair of power lines connected to a pair of complementary bit lines of the at least one sense amplifier, the pair of power lines configured to apply a voltage to the pair of complementary bit lines;
the internal voltage driver is a plurality of internal voltage drivers configured to apply the internal voltage to the pair of power lines during the amplification period of the at least one sense amplifier; and
the over driver is a plurality of over drivers configured to apply the external voltage to the pair of power lines during the sensing period of the at least one sense amplifier,
wherein the plurality of over drivers are configured to perform the over driving operation by each memory block unit.

10. A semiconductor memory device comprising:
a memory cell array including a plurality of memory blocks, the plurality of memory blocks included in a plurality of memory block units including one or more of the plurality of memory blocks, each of the memory blocks including at least one sense amplifier connected to a memory cell;
an over driver configured to perform an over driving operation on the at least one sense amplifier;
a controller configured to generate a first signal if a sensing operation of the at least one sense amplifier is started; and
a row decoder configured to receive an address, decode the address to activate a corresponding word line of the memory cell array, and generate a second signal to select the one or more memory blocks corresponding to a memory block unit, wherein the over driver is configured to perform the over driving operation by each memory block unit in response to the first and second signals.

11. The semiconductor memory device of claim 10, wherein the second signal is based on a most significant bit (MSB) of the address.

12. The semiconductor memory device of claim 10, wherein the memory cell array includes a plurality of power lines configured to apply a voltage to bit lines of sense amplifiers of each of the memory blocks, and the over driver is configured to apply an external voltage to the power lines of the selected memory block unit in response to the first and second signals.

13. The semiconductor memory device of claim 12, wherein the memory cell array includes an internal voltage driver configured to apply an internal voltage to the power lines.

14. The semiconductor memory device of claim 13, wherein the power lines are configured to receive the internal voltage from the internal voltage driver in an amplification period of the sense amplifier.

15. The semiconductor memory device of claim 12, wherein the over driver includes a current adjustment circuit configured to adjust an amount of current flowing through the power lines such that the external voltage is applied to the power lines at a given rate.

16. The semiconductor memory device of claim 15, wherein the current adjustment circuit is turned on in response to a third signal, and the third signal is provided from an inside of the controller.

17. The semiconductor memory device of claim 10, wherein the over driver is disposed above and below the memory cell array.

18. The semiconductor memory device of claim 10, wherein the second signal includes a plurality of block signals for selecting memory blocks, and the over driver includes a plurality of external voltage generators configured to receive the first signal and the plurality of block signals to generate the external voltage.

19. An over driving method of a sense amplifier, the method comprising:

generating an over driving signal in a sensing period of the sense amplifier;

selecting a portion of a plurality of memory blocks to be over-driven; and performing an over driving operation on only the selected portion of the plurality of memory blocks in response to the over driving signal.

20. The method of claim 19, wherein the selecting the portion of the plurality of memory blocks includes generating a block signal for selecting the memory blocks.

21. The method of claim 20, wherein the block signal is generated based on a most significant bit (MSB) of an inputted address.

22. The method of claim 19, wherein the over driving signal is generated if a sensing operation of the sense amplifier is started.

23. The method of claim 19, wherein the performing the over driving operation includes adjusting an amount of current applied to the sense amplifier such that a given amount of current flows if the over driving operation is performed.

* * * * *